(12) United States Patent
Huang

(10) Patent No.: US 8,211,789 B2
(45) Date of Patent: Jul. 3, 2012

(54) MANUFACTURING METHOD OF A BUMP STRUCTURE HAVING A REINFORCEMENT MEMBER

(75) Inventor: Cheng-Tang Huang, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 13/104,980

(22) Filed: May 11, 2011

(65) Prior Publication Data
US 2011/0212615 A1 Sep. 1, 2011

Related U.S. Application Data

(62) Division of application No. 11/836,146, filed on Aug. 9, 2007, now Pat. No. 7,969,003.

(30) Foreign Application Priority Data

Feb. 5, 2007 (TW) .............................. 96104048 A

(51) Int. Cl.
*H01L 21/44* (2006.01)
(52) U.S. Cl. ...................... 438/613; 438/666; 438/669
(58) Field of Classification Search .................. None
See application file for complete search history.

(56) References Cited

U.S. PATENT DOCUMENTS

| | | | |
|---|---|---|---|
| 6,187,615 B1 * | 2/2001 | Kim et al. ..................... 438/113 |
| 6,578,755 B1 * | 6/2003 | Elenius et al. ................. 228/254 |
| 6,854,633 B1 * | 2/2005 | Grigg et al. ..................... 228/33 |
| 6,956,292 B2 * | 10/2005 | Fan et al. ....................... 257/780 |
| 7,129,111 B2 * | 10/2006 | Tsai .............................. 438/106 |
| 7,651,937 B2 * | 1/2010 | Hsieh et al. ..................... 438/613 |
| 2004/0166661 A1 * | 8/2004 | Lei .................................. 438/614 |
| 2004/0266162 A1 * | 12/2004 | Feng .............................. 438/613 |
| 2005/0082670 A1 * | 4/2005 | Quinones et al. .............. 257/737 |
| 2006/0038291 A1 * | 2/2006 | Chung et al. .................. 257/738 |
| 2007/0015312 A1 * | 1/2007 | Tsai ............................. 438/106 |
| 2007/0018322 A1 * | 1/2007 | Park et al. ...................... 257/738 |

* cited by examiner

*Primary Examiner* — Scott B Geyer
(74) *Attorney, Agent, or Firm* — Jianq Chyun IP Office

(57) ABSTRACT

A manufacturing method of a bump structure having a reinforcement member is disclosed. First, a substrate including pads and a passivation layer is provided. The passivation layer has first openings, and each first opening exposes a portion of the corresponding pad respectively. Next, an under ball metal (UBM) material layer is formed on the substrate to cover the passivation layer and the pads exposed by the passivation layer. Bumps are formed on the UBM material layer and the lower surface of each bump is smaller than that of the opening. Each reinforcement member formed on the UBM material layer around each bump contacts with each bump, and the material of the reinforcement member is a polymer. The UBM material layer is patterned to form UBM layers and the lower surface of each UBM layer is larger than that of each corresponding opening. Hence, the bump has a planar upper surface.

5 Claims, 4 Drawing Sheets

1 …

MANUFACTURING METHOD OF A BUMP STRUCTURE HAVING A REINFORCEMENT MEMBER

CROSS-REFERENCE TO RELATED APPLICATION

This application is a divisional application of and claims the priority benefit of U.S. application Ser. No. 11/836,146, filed on Aug. 9, 2007, now patented, issue no. U.S. Pat. No. 7,969,003, which claims the priority benefit of Taiwan application serial no. 96104048, filed on Feb. 5, 2007. The entirety of each of the above-mentioned patent applications is hereby incorporated by reference herein and made a part of this specification.

BACKGROUND OF THE INVENTION

1. Field of the Invention

The invention relates to a method of manufacturing a semiconductor structure, and more particularly to a manufacturing method of a bump structure.

2. Description of Related Art

Flip chip interconnection technology is a packaging technique for connecting a die to a circuit board, which mainly is forming a plurality of bumps on a plurality of pads of the die. Afterwards, the die is flipped over and the bumps are used for connecting the pads of the die to terminals on the circuit board, so that the die is electrically connected to the circuit board through the bumps. Generally, there are several types of bumps, such as solder bumps, gold bumps, copper bumps, conductive polymer bumps, polymer bumps and so on.

FIG. 1A is a cross-sectional view of a conventional gold bump, and FIG. 1B is a top view of the conventional gold bump. As indicated in FIG. 1A and FIG. 1B, a conventional gold bump structure is suitable to be disposed on a die 110 and a plurality of aluminum pads 120 (only one shown in FIGS. 1A and 1B) and a passivation layer 130 have already formed on the die 110. The passivation layer 130 has a plurality of openings 130a exposing a portion of each of the aluminum pads 120 respectively. Additionally, the conventional gold bump structure includes an under ball metal (UBM) layer 140 and a gold bump 150. The UBM layer 140 is disposed within the opening 130a and covers a portion of the passivation layer 130. The gold bump 150 is disposed on the UBM layer 140. The gold bump 150 covers the UBM layer 140 on a portion of the passivation layer 130. As a result, an annular protrusion 150a is formed on the gold bump 150, which is the so-called wall effect. However, the annular protrusion 150a would affect the bonding strength between the gold bump 150 and other carriers (not shown). Moreover, since the UBM layer 140 is merely disposed beneath the gold bump 150, when cracks occur between the UBM layer 140 and the gold bump 150, or between the UBM layer 140 and the passivation layer 130, the under cut effect is prone to occur in the conventional gold bump structure.

SUMMARY OF THE INVENTION

The invention provides a manufacturing method of a bump structure with a reinforcement member so as to mitigate the wall effect.

The manufacturing method of a bump structure with a reinforcement member disclosed by the invention includes the following steps. First, a substrate including a plurality of pads and a passivation layer is provided. The passivation layer has a plurality of first openings, and each of the first openings exposes a portion of the corresponding pad respectively. Next, an under ball metal (UBM) material layer is formed on the substrate to cover the passivation layer and the pads exposed by the passivation layer. A plurality of bumps is formed on the UBM material layer over the pads exposed by the passivation layer. The lower surface of each of the bumps is smaller than the lower surface of each of the corresponding first openings, and the upper surface of each of the bumps is planar. A reinforcement member is formed on the UBM material layer around each of the bumps. Each of the reinforcement members respectively contacts with each of the bumps, and the material of the enforcement member is a polymer. The UBM material layer is patterned to form a plurality of UBM layers. The lower surface of each of the UBM layers is larger than the lower surface of each of the corresponding first openings.

In one embodiment of the invention, the method of forming the bumps includes forming a patterned photoresist layer on the UBM material layer. The patterned photoresist layer has a plurality of second openings respectively exposing the UBM material layer exposed by the passivation layer on the pads. The bumps are formed within the second openings. The patterned photoresist layer is removed.

In one embodiment of the invention, the method of forming the reinforcement member may include forming a polymer layer on the UBM material layer. The polymer layer exposes and contacts with the bumps. Afterwards, the polymer layer is patterned to form the reinforcement member.

In one embodiment of the invention, the method of patterning the polymer layer may include performing an exposure process and a developing process.

In one embodiment of the invention, the method of forming the UBM layer may include using the reinforcement member as a mask to remove a portion of the UBM material layer.

In view of the above, the bumps are formed within the openings of the passivation layer in the invention, and accordingly this type of bump has a planar upper surface. Moreover, since the reinforcement member simultaneously contacts the UBM layer and the bumps, the under cut effect is less prone to occur in this type of bump structure.

In order to make the aforementioned and other objects, features and advantages of the invention more comprehensible, embodiments accompanied with figures are described in detail below.

DESCRIPTION OF EMBODIMENTS

Figure 1A:
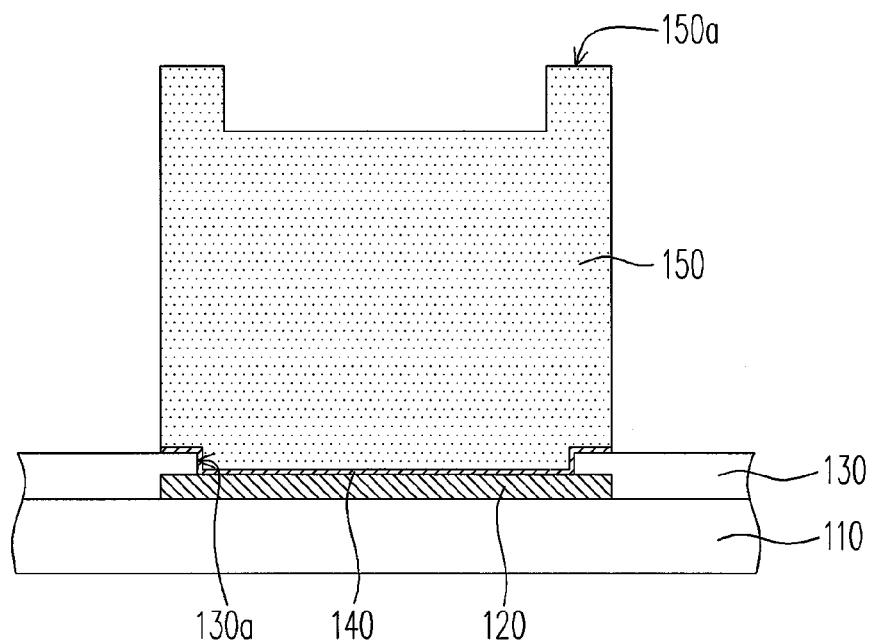
FIG. 1A is a cross-sectional view of a conventional gold bump.
Figure 1B:
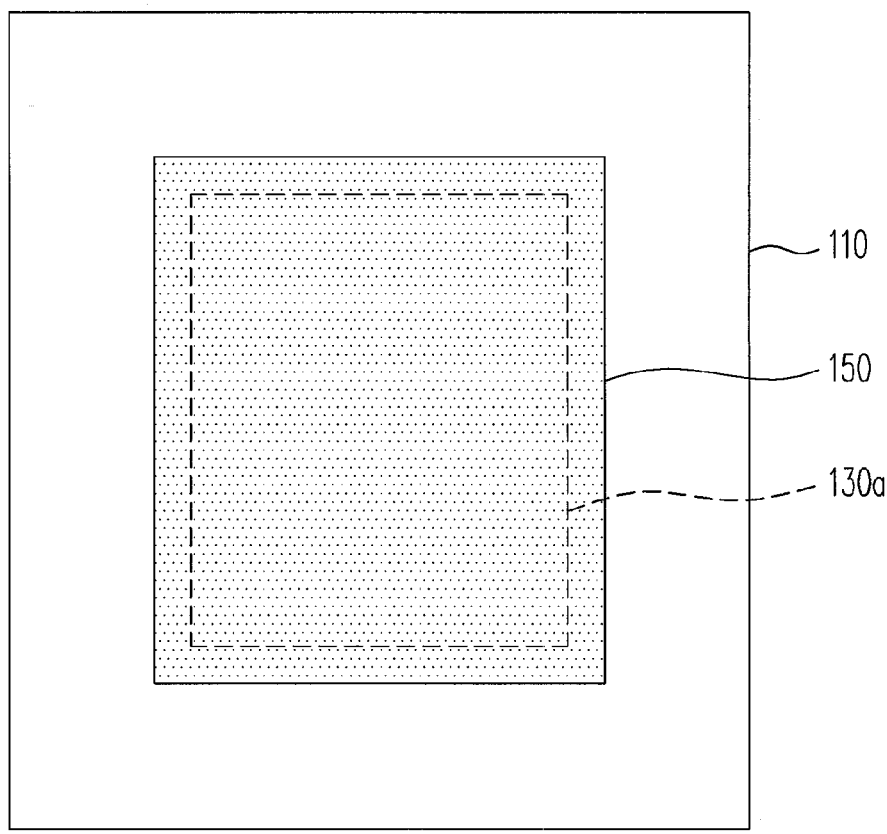
FIG. 1B is a top view of the conventional gold bump.
Figure 2A:
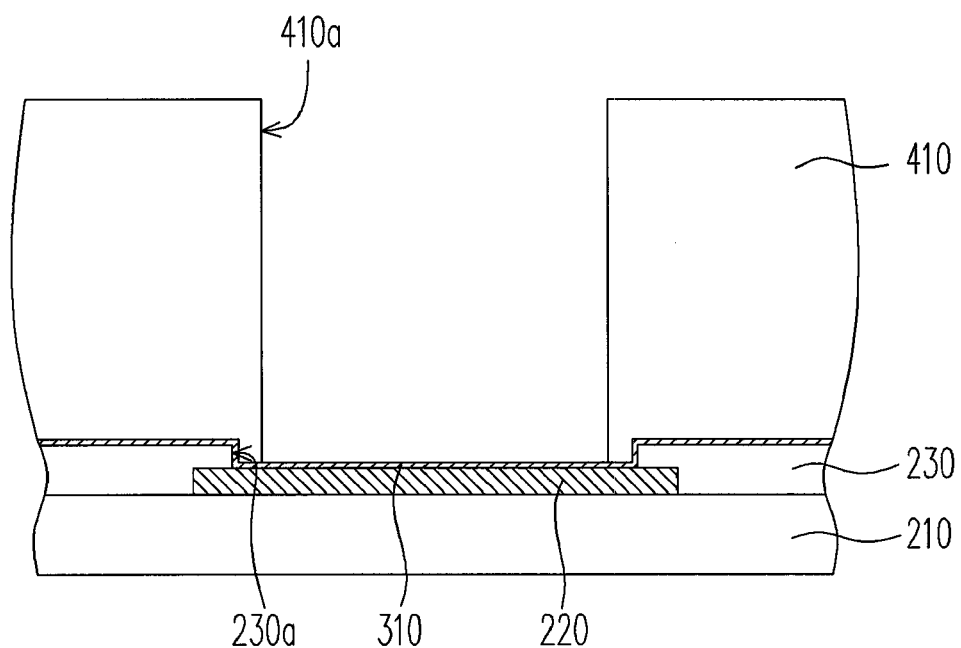
FIG. 2A to FIG. 2D are schematic diagrams illustrating a manufacturing method of a bump structure with a reinforcement member according to one embodiment of the invention.

FIG. 2A to FIG. 2D are schematic diagrams illustrating a manufacturing method of a bump structure with a reinforcement member according to one embodiment of the invention. First, as shown in FIG. 2A, the manufacturing method of the bump structure in the present embodiment includes the following steps. First, a substrate 210 including a plurality of pads 220 and a passivation layer 230 is provided. The passivation layer 230 has a plurality of first openings 230a, and each of the first openings 230a exposes a portion of the corresponding pad 220 respectively. It should be noted that in order to better illustrate the present embodiment, only one of the openings 230a and one of the pads 220 are shown in the figures. Furthermore, the substrate 210 may be a wafer or any other carrier, and the material of the pad 220 may be aluminum, copper, or any other metal.

As indicated in FIG. 2A, an under ball metal (UBM) material layer 310 is formed on the substrate 210 so as to cover the passivation layer 230 and the portion of the pad 220 exposed by the passivation layer 230. In addition, the method of forming the UBM material layer 310 may include performing a sputtering process, a physical vapor deposition (PVD) process, or a chemical vapor deposition (CVD) process. Then, a patterned photoresist layer 410 is formed on the UBM material layer 310. The patterned photoresist layer 410 has a plurality of second openings 410a respectively exposing the UBM material layer 310 exposed by the passivation layer 230 on the pads 220. It is noticed that the second opening 410a is smaller than the pad 220 and the first opening 230a.

Figure 2B:
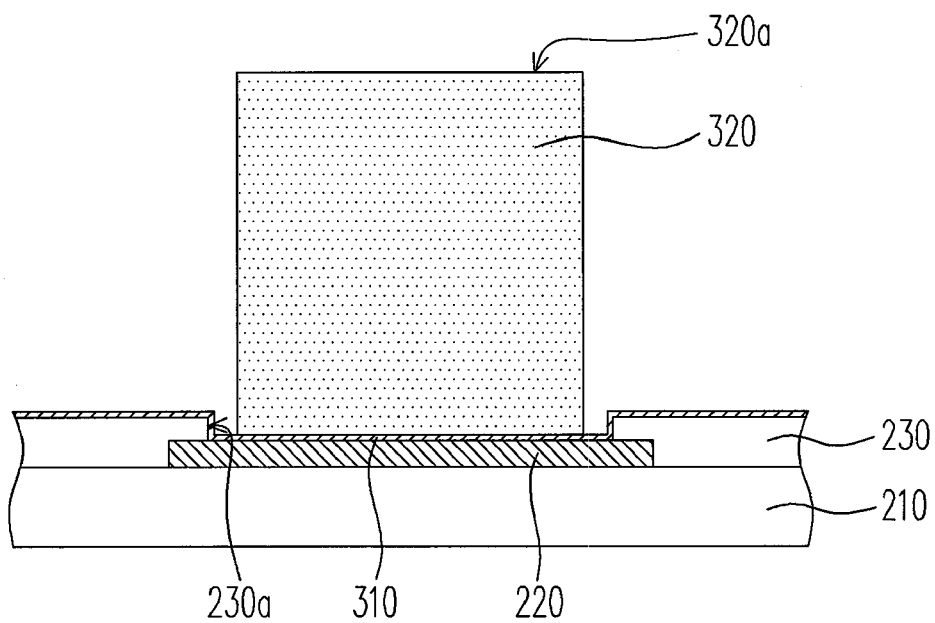

As indicated in FIG. 2A and FIG. 2B, bumps 320 are formed within the second openings 410a. In other words, a plurality of bumps 320 are formed on the UBM material layer 310 exposed by the passivation layer 230 on the pads 220. Additionally, the bumps 320 may be formed by performing a plating process. Next, the patterned photoresist layer 410 is removed. It is noted that the lower surface of each of the bumps 320 is smaller than the lower surface of the corresponding first opening 230a. The upper surface 320a of the bump 320 is planar.

Figure 2C:
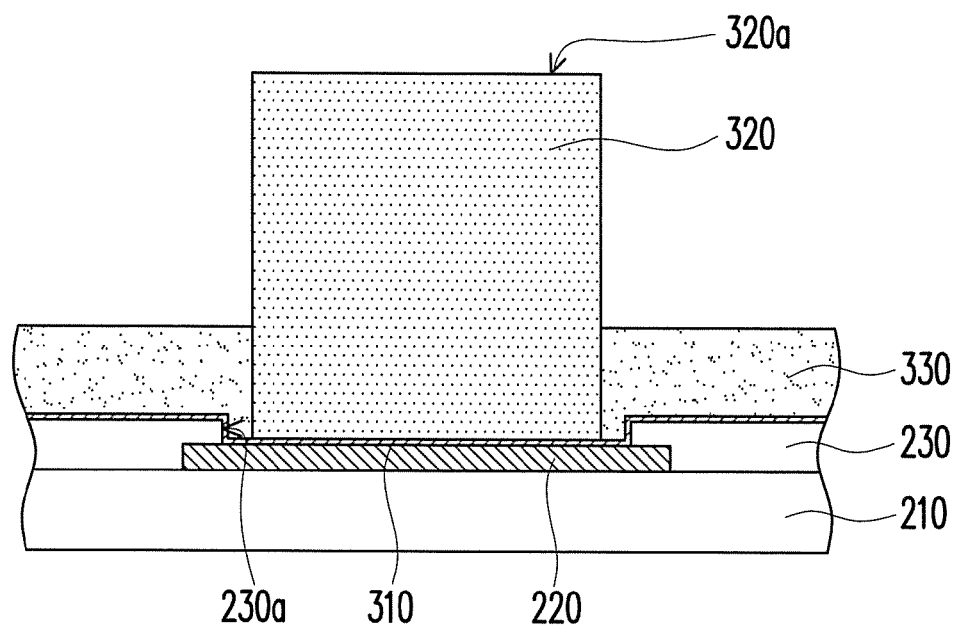

As indicated in FIG. 2C, a polymer layer 330 is formed on the UBM material layer 310. The polymer layer 330 exposes the bumps 320 and contacts with the bumps 320. Furthermore, the method of forming the polymer layer 330 may be a spin coating process.

Figure 2D:
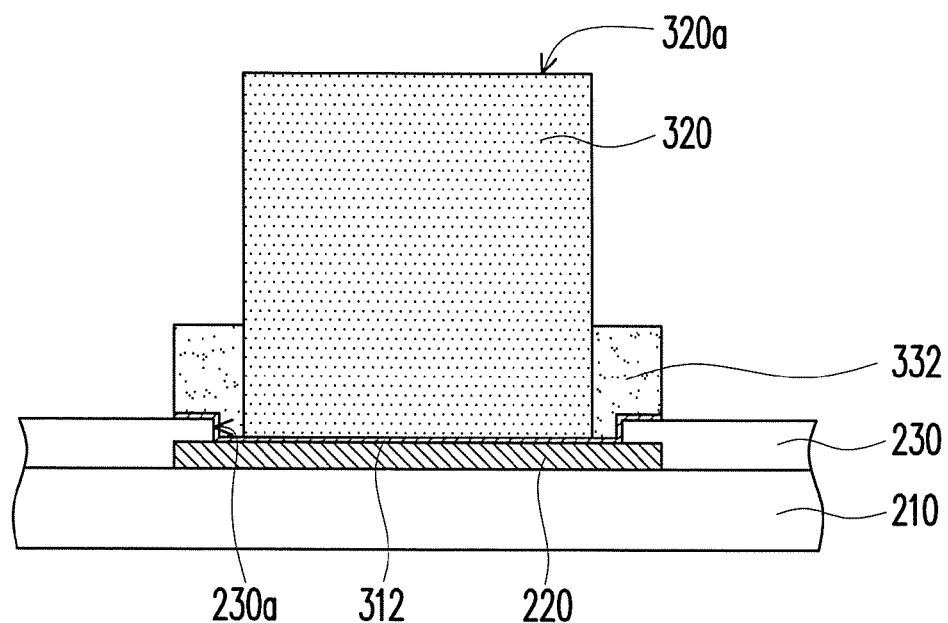

As indicated in FIG. 2C and FIG. 2D, the polymer layer 330 is patterned to form a reinforcement member 332. More specifically, the method of patterning the polymer layer 330 may include performing an exposure process and a developing process. Next, the UBM material layer 310 is patterned to form a plurality of UBM layers 312. The lower surface of each of the UBM layers 312 is larger than the lower surface of each of the corresponding first openings 230a. In the present embodiment, the UBM material layer 310 may be patterned by using the reinforcement member 332 as a mask to remove a portion of the UBM material layer 310. At this moment, the profiles of the UBM layer 312 and the reinforcement member 332 are the same. However, the UBM material layer 310 may also be patterned by forming another patterned photoresist layer (not shown), and then using the patterned photoresist layer as a mask to remove a portion of the UBM material layer 310. Up until the present, the manufacturing process of the bump structure with a reinforcement member according to the present embodiment is basically completed. Additionally, after the reinforcement member 332 is formed, a cutting process may also be performed on the substrate 210 to form a plurality of die structures (not shown). A description of the detailed bump structure with a reinforcement member is provided as follows.

Figure 3:
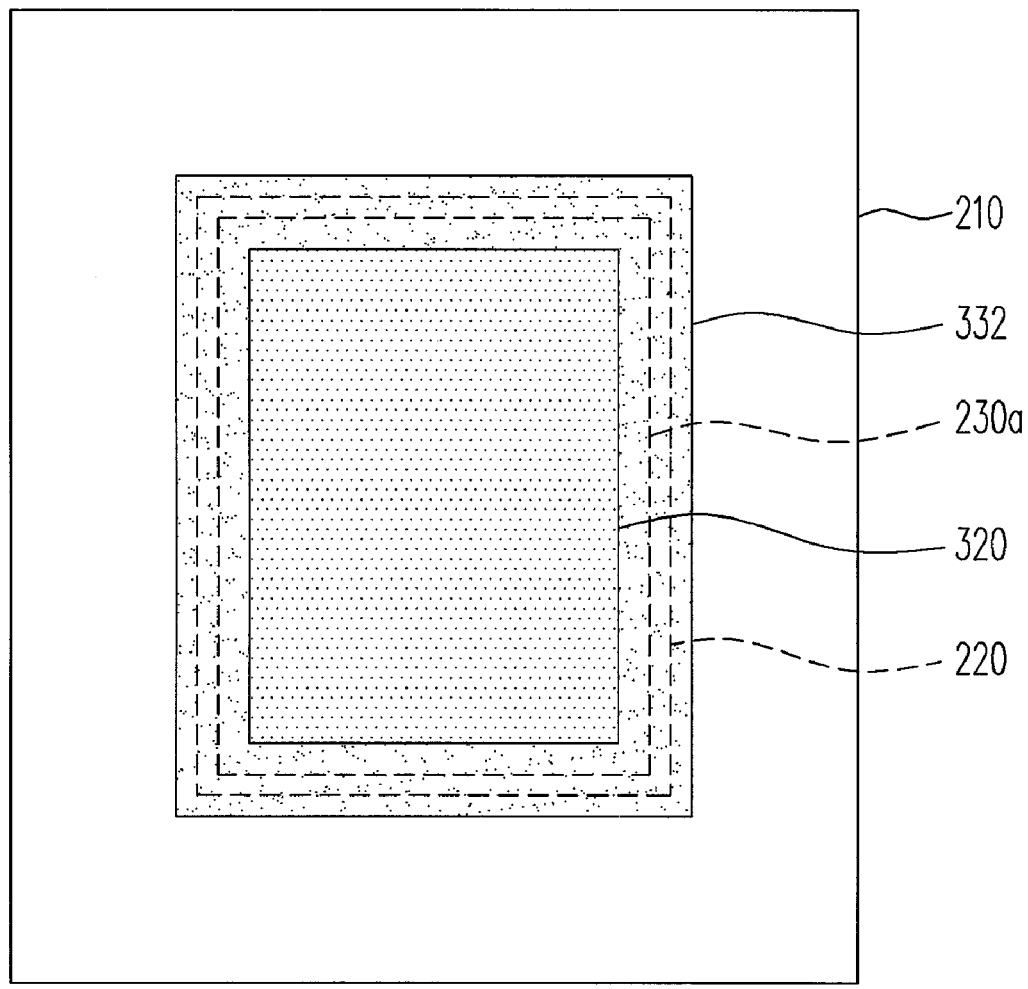
FIG. 3 is a top view of a bump structure with a reinforcement member according to one embodiment of the invention.

FIG. 3 is a top view of a bump structure with a reinforcement member according to one embodiment of the invention. As indicated in FIG. 3 and FIG. 2D, the bump structure having the enforcement member is suitable to be disposed on a substrate 210. The substrate 210 has a pad 220 and a passivation layer 230. The passivation layer 230 has a first opening 230a exposing a portion of the pad 220. Besides, the substrate 210 may be a die or a wafer. The bump structure with the reinforcement member includes a UBM layer 312, a bump 320, and a reinforcement member 332. The UBM layer 312 is disposed on the passivation layer 230 and covers the pad 220 exposed by the passivation layer 230. The bump 320 is disposed on the UBM layer 312 on the pad 220. The upper surface 320a of the bump 320 is a planar surface. Besides, the lower surface of the bump 320 is smaller than the lower surface of the first opening 230a, and the lower surface of the UBM layer 312 is larger than the lower surface of the first opening 230a (as shown in FIG. 3). In addition, the material of the bumps 320 may be gold. The reinforcement member 332 is disposed on the UBM layer 312, located around the bumps 320, and contacts with the bumps 320. More specifically, the material of the enforcement member 332 is a polymer. The material of the polymer may be polyimide (PI) or any other suitable material. The shape of the reinforcement member 332 may be annular.

Since the bumps 320 are formed within the first openings 230a of the passivation layer 230 and the lower surface of the bump 320 is smaller than the lower surface of the first opening 230a, the bump 320 has a planar upper surface 320a, which mitigates the wall effect in the conventional technology. Moreover, since the reinforcement member 332 simultaneously contacts the UBM layer 312 and the bumps 320, the under cut effect is less prone to occur in this type of bump structure with the reinforcement member 332.

Although the invention has been disclosed above by the embodiments, they are not intended to limit the invention. Anybody ordinarily skilled in the art can make some modifications and alterations without departing from the spirit and scope of the invention. Therefore, the protecting range of the invention falls in the appended claims.

What is claimed is:

1. A manufacturing method of a bump structure having a reinforcement member, comprising:
    providing a substrate comprising a plurality of pads and a passivation layer, wherein the passivation layer has a plurality of first openings, each of the first openings respectively exposing a portion of the corresponding pad;
    forming an under ball metal material layer on the substrate to cover the passivation layer and the pads exposed by the passivation layer;
    forming a plurality of bumps on the under ball metal material layer on the pads exposed by the passivation layer, wherein a lower surface of each of the bumps is smaller than a lower surface of each of the corresponding first openings, and an upper surface of each of the bumps is planar;
    forming a reinforcement member on the under ball metal material layer around each of the bumps, wherein each of the reinforcement members contacts with each of the bumps, a portion of the reinforcement member is located in each of the first openings, edges of the reinforcement member are aligned with edges of the under ball metal layers, a top surface of each of the reinforcement members is lower than a top surface of each of the bumps, and the material of the reinforcement member is a polymer; and
    patterning the under ball metal material layer to form a plurality of under ball metal layers, wherein a lower surface of each of the under ball metal layers is larger than the lower surface of each of the corresponding first openings.

2. The manufacturing method of the bump structure having the reinforcement member as claimed in claim 1, wherein the method of forming the bumps comprises:

forming a patterned photoresist layer on the under ball metal material layer, wherein the patterned photoresist layer has a plurality of second openings respectively exposing the under ball metal material layer exposed by the passivation layer on the pads;

forming the bumps within the second openings; and removing the patterned photoresist layer.

3. The manufacturing method of the bump structure having the reinforcement member as claimed in claim 1, wherein the method of forming the reinforcement members comprises:

forming a polymer layer on the under ball metal material layer, wherein the polymer layer exposes the bumps and contacts with the bumps; and patterning the polymer layer to form the reinforcement members.

4. The manufacturing method of the bump structure having the reinforcement member as claimed in claim 3, wherein the method of patterning the polymer layer comprises an exposure process and a developing process.

5. The manufacturing method of the bump structure having the reinforcement member as claimed in claim 1, wherein the method of forming the under ball metal layers comprises using the reinforcement members as masks to remove a portion of the under ball metal material layer.

\* \* \* \* \*